United States Patent
Bergman

(10) Patent No.: US 7,404,863 B2
(45) Date of Patent: *Jul. 29, 2008

(54) METHODS OF THINNING A SILICON WAFER USING HF AND OZONE

(75) Inventor: Eric J. Bergman, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 7 days.

This patent is subject to a terminal disclaimer.

(21) Appl. No.: 10/631,376

(22) Filed: Jul. 30, 2003

(65) Prior Publication Data

US 2004/0020513 A1 Feb. 5, 2004

Related U.S. Application Data

(63) Continuation-in-part of application No. 09/621,028, filed on Jul. 21, 2000, now Pat. No. 6,869,487, application No. 10/631,376, which is a continuation-in-part of application No. 08/853,649, filed on May 9, 1997, now Pat. No. 6,240,933, and a continuation-in-part of application No. PCT/US99/08516, filed on Apr. 16, 1999, and a continuation-in-part of application No. 09/061,318, filed on Apr. 16, 1998, now abandoned.

(60) Provisional application No. 60/145,350, filed on Jul. 23, 1999, provisional application No. 60/125,304, filed on Mar. 19, 1999, provisional application No. 60/099,067, filed on Sep. 3, 1998.

(51) Int. Cl.
*B08B 3/00* (2006.01)
*B08B 3/04* (2006.01)

(52) U.S. Cl. .................. 134/3; 134/2; 134/25.4; 134/30; 134/31; 134/33; 134/36; 134/902

(58) Field of Classification Search ............... 134/2, 134/3, 21, 25.4, 30, 31, 33, 36, 902
See application file for complete search history.

(56) References Cited

U.S. PATENT DOCUMENTS

| | | | |
|---|---|---|---|
| 4,186,032 A | 1/1980 | Ham | |
| 4,695,327 A | 9/1987 | Grebinski | |
| 4,749,440 A | 6/1988 | Blackwood et al. | |
| 4,778,532 A | 10/1988 | McConnell et al. | |
| 4,817,652 A | 4/1989 | Liu | |
| 4,899,767 A | 2/1990 | McConnell et al. | |
| 4,917,123 A | 4/1990 | McConnell et al. | |
| 4,974,530 A | 12/1990 | Lyon | |
| 5,032,218 A | 7/1991 | Dobson | |
| 5,055,138 A | 10/1991 | Slinn | |
| 5,063,609 A | 11/1991 | Lorimer | |
| 5,071,485 A | 12/1991 | Matthews et al. | |
| 5,105,556 A | 4/1992 | Kurokawa et al. | |
| 5,120,370 A | 6/1992 | Mori et al. | |
| 5,181,985 A | 1/1993 | Lampert et al. | |
| 5,232,511 A | 8/1993 | Bergman | |
| 5,234,540 A | 8/1993 | Grant et al. | |
| 5,235,995 A | 8/1993 | Bergman et al. | |
| 5,244,000 A | 9/1993 | Stanford et al. | |
| 5,246,526 A | 9/1993 | Yamaguchi et al. | |
| 5,248,380 A | 9/1993 | Tanaka | |
| 5,308,745 A | 5/1994 | Schwartzkopf | |
| 5,326,406 A | 7/1994 | Kaneko et al. | |
| 5,372,651 A | 12/1994 | Kodama | |
| 5,378,317 A | 1/1995 | Kashiwase et al. | |
| 5,415,191 A | 5/1995 | Mashimo et al. | |
| 5,423,944 A * | 6/1995 | Wong .................. 438/706 |
| 5,464,480 A | 11/1995 | Matthews | |
| 5,503,708 A | 4/1996 | Koizumi et al. | |
| 5,520,744 A | 5/1996 | Fujikawa et al. | |

(Continued)

FOREIGN PATENT DOCUMENTS

| | | |
|---|---|---|
| DE | 19801360 A1 | 7/1999 |
| EP | 0 344 764 | 12/1989 |
| EP | 0 548 596 | 6/1993 |
| EP | 0587889 | 3/1994 |
| EP | 0 702 399 | 3/1996 |
| EP | 0782177 | 7/1997 |
| GB | 2 287 827 | 9/1995 |
| JP | 52-12063 | 4/1977 |
| JP | 54-034751 | 3/1979 |
| JP | 61-004232 | 1/1986 |

(Continued)

OTHER PUBLICATIONS

Alder, M., et al., "The Kinetics and Mechanism of Hydroxide Ion Catalyzed Ozone Decomposition in Aqueous Solution." *J. Am. Chem. Soc.*, 72:1884-1886 (1950).

Amick, J.A., "Cleanliness and the Cleaning of Silicon Wafers." *Solid State Technology*, pp. 47-52 (Nov. 1976).

Anantharaman, et al., "Organics: Detection and Characterization of Organics in Semiconductor DI Water Processes." *Ultrapure Water*, pp. 30-36 (Apr. 1994).

(Continued)

*Primary Examiner*—Zeinab El-Arini
(74) *Attorney, Agent, or Firm*—Kenneth H. Ohriner; Perkins Coie LLP

(57) ABSTRACT

A method of thinning a silicon wafer in a controllable cost-effective manner with minimal chemical consumption. The wafer is placed into a process chamber, after which ozone gas and HF vapor are delivered into the process chamber to react with a silicon surface of the wafer. The ozone and HF vapor may be delivered sequentially, or may be mixed with one another before entering the process chamber. The ozone oxidizes the silicon surface of the wafer, while the HF vapor etches the oxidized silicon away from the wafer. The etched oxidized silicon is then removed from the process chamber. As a result, the wafer is thinned, which aids in preventing heat build-up in the wafer, and also makes the wafer easier to handle and cheaper to package. In alternative embodiments, HF may be delivered into the process chamber as an anhydrous gas or in aqueous form.

6 Claims, 3 Drawing Sheets

U.S. PATENT DOCUMENTS

| | | | |
|---|---|---|---|
| 5,571,367 | A | 11/1996 | Nakajima et al. |
| 5,632,847 | A | 5/1997 | Ohno et al. |
| 5,647,386 | A | 7/1997 | Kaiser |
| 5,658,615 | A | 8/1997 | Hasebe et al. |
| 5,705,089 | A | 1/1998 | Sugihara et al. |
| 5,714,203 | A | 2/1998 | Schellenberger et al. |
| 5,749,975 | A | 5/1998 | Li et al. |
| 5,776,296 | A | 7/1998 | Matthews |
| 5,803,982 | A | 9/1998 | Kosofsky et al. |
| 5,832,177 | A | 11/1998 | Shinagawa et al. |
| 5,858,107 | A | 1/1999 | Chao et al. |
| 5,896,875 | A | 4/1999 | Yoneda |
| 5,911,837 | A | 6/1999 | Matthews |
| 5,922,624 | A * | 7/1999 | Verhaverbeke et al. ...... 438/743 |
| 5,944,907 | A | 8/1999 | Ohmi |
| 5,950,643 | A | 9/1999 | Miyazaki et al. |
| 5,964,952 | A | 10/1999 | Kunze-Concewitz |
| 5,964,954 | A | 10/1999 | Matsukawa et al. |
| 5,971,368 | A | 10/1999 | Nelson et al. |
| 5,994,238 | A * | 11/1999 | Park ........................... 438/738 |
| 6,146,469 | A | 11/2000 | Toshima |
| 6,162,734 | A | 12/2000 | Bergman et al. |
| 6,249,933 | B1 | 6/2001 | Berfield |
| 6,267,125 | B1 | 7/2001 | Bergman et al. |
| 6,273,108 | B1 | 8/2001 | Bergman et al. |
| 6,299,696 | B2 | 10/2001 | Kamikawa et al. |
| 6,497,768 | B2 | 12/2002 | Bergman |
| 6,551,409 | B1 | 4/2003 | DeGendt et al. |
| 6,582,525 | B2 | 6/2003 | Bergman |
| 6,740,247 | B1 * | 5/2004 | Han et al. ..................... 216/73 |
| 6,758,938 | B1 | 7/2004 | Torek |
| 6,806,205 | B2 | 10/2004 | Jang et al. |
| 6,817,370 | B2 | 11/2004 | Bergman et al. |
| 2002/0011257 | A1 | 1/2002 | DeGendt |
| 2004/0103919 | A1 * | 6/2004 | Kenny et al. .................. 134/19 |
| 2004/0214432 | A1 * | 10/2004 | Masumoto .................. 438/689 |
| 2005/0006738 | A1 * | 1/2005 | Schaper et al. .............. 257/678 |

FOREIGN PATENT DOCUMENTS

| | | |
|---|---|---|
| JP | 62-117330 | 5/1987 |
| JP | 63-110732 | 5/1988 |
| JP | 64-008630 | 1/1989 |
| JP | 01-042129 | 2/1989 |
| JP | 01-189921 | 7/1989 |
| JP | 1189921 | 7/1989 |
| JP | H01-262627 | 10/1989 |
| JP | 03-041729 | 2/1991 |
| JP | 03-072626 | 3/1991 |
| JP | H03-208900 | 9/1991 |
| JP | 04-079221 | 3/1992 |
| JP | H04-125927 | 4/1992 |
| JP | 04-302144 | 10/1992 |
| JP | 04-302145 | 10/1992 |
| JP | H04-298038 | 10/1992 |
| JP | 04-370931 | 12/1992 |
| JP | 05-013398 | 1/1993 |
| JP | 05-109686 | 4/1993 |
| JP | 05-259139 | 10/1993 |
| JP | 05-283389 | 10/1993 |
| JP | 06-204130 | 7/1994 |
| JP | 07-159980 | 6/1995 |
| JP | 08-008222 | 1/1996 |
| WO | WO99/52654 | 10/1999 |

OTHER PUBLICATIONS

Baumgärtner, H., et al., "Ozone Cleaning of the Si-SiO$_2$ System." *Appl. Phys. A*, 43:223-226 (1987).

Bedge, S., et al., "Kinetics of UV/O$_2$ Cleaning and Surface Passivation: Experiments and Modeling." *Mat. Res. Soc. Symp. Proc.*, 259:207-212 (1992).

Bolon, D.A., et al., "Ultraviolet Deploymerization of Photoresist Polymers," *Polymer Engineering and Science*, 12(2):108-111 (1972).

Christenson, K., et al., "Deionized Water Helps Remove Wafer Stripping 'Resist'-ance." www.precisioncleaningweb.com—*Precision Cleaning Web—Archives*, pp. 10-20 (Apr. 1998).

Egitto, F.D., et al., "Removal of Poly (Dimethylsiloxane) Contamination From Silicon Surfaces With UV/Ozone Treatment." *Mat. Res. Soc. Symp. Proc.*, 385:245-250 (1995).

Gabriel, C., et al., "Reduced Device Damage Using An Ozone Based Photoresist Removal Process." *SPIE Advances in Resist Technology and Processing VI*, 1086:598-604 (1989).

Ganesan, G., et al., "Characterizing Organic Contamination in IC Package Assembly." *The Int'l. Soc. for Hybrid Microelectronics*, 17(2), Second Quarter, 152-160 (1994).

Golland, D.E., et al., "The Clean Module: Advanced Technology for Processing Silicon Wafers." *Semiconductor Int'l.*, pp. 154-157 (Sep. 1987).

Goulding, M.R., "The selective epitaxial growth of silicon," *Materials Science and Engineering*, vol. B17, pp. 47-67 (1993).

Heyns, M.M., et al., "New Wet Cleaning Strategies for Obtaining Highly Reliable Thin Oxides." *MRP Symposium Proceedings on Materials Research Society*, Spring Meeting, San Francisco, CA, Apr. 12-13, p. 35 (1993).

Huynh, C., et al., "Plasma versus ozone photoresist ashing: Temperature effects on process-induced mobile ion contamination." *J. Vac. Sci. Technol.*, B9(2):353-356 (Mar./Apr. 1991).

Isagawa, T., et al., "Ultra Clean Surface Preparation Using Ozonized Ultrapure Water." *Extended Abstracts of the 1992 Int'l. Conf. on Solid State Devices and Materials*; pp. 193-195 (1992).

Kasi, S., et al., "Surface Hydrocarbon Removal from Si by UV/Ozone." *ECS Extended Abstracts*, No. 458, pp. 691-692 (1990).

Kasi, S., et al., "Vapor phase hydrocarbon removal for Si processing." *Appl. Phys. Lett.*, 57(20):2095-2097 (Nov. 1990).

Kern, W., "The Evolution of Silicon Wafer Cleaning Technology." *J. Electrochem. Soc.*, 137(6):1887-1892 (Jun. 1990).

Krusell, W.C., et al., "Cleaning Technologies for High Volume Production of Silicon Wafers." *ECS Proc. of the First Int'l. Symposium on Cleaning Technology in Semiconductor Device Mfg.*, pp. 23-32 (Oct. 1989).

Krusell, W.C., et al., "The Characterization of Silicon Substrate Cleaning Treatments by use of SIMS and MOS Electrical Testing." *ECS Extended Abstracts*, No. 229, p. 331-332 (1986).

Nelson, S., "Ozonated water for photoresist removal." *Solid State Technology*, p. 107-112 (Jul. 1999).

Ohmi, T., et al., "Native Oxide Growth and Organic Impurity Removal on Si Surface with Ozone-Injected Ultrapure Water." *J. Electrochem. Soc.*, 140(3):804-810 (Mar. 1993).

Sehested, K., et al., "Decomposition of Ozone in Aqueous Acetic Acid Solutions (pH 0-4)." *J. Phys. Chem.*, pp. 1005-1009 (1992).

Shimada, H., et al., "Residual-Surfactant-Free Photoresist Development Process." *J. Electrochem., Soc.*, 139(6):1721-1730 (Jun. 1992).

Suemitsu, M., et al., "Low Temperature Silicon Surface Cleaning by HF Etching/Ultraviolet Ozone Cleaning (HF/UVOC) Method (I)-Optimization of the HF Treatment." *Japanese Journal of Applied Physics*, 28(12):2421-2424 (Dec. 1989).

Tabe, M., "UV ozone cleaning of silicon substrates in silicon molecular beam epitaxy." *Appl. Phys. Lett.*, 45(10):1073-1075 (Nov. 1984).

Tong, J., et al., "Aqueous Ozone Cleaning of Silicon Wafers." *ECS Extended Abstracts*, Phoenix, AZ, Abstract No. 506, pp. 753 (Oct. 13-17, 1991).

Tong, J., et al., "Aqueous Ozone Cleaning of Silicon Wafers." *Proc. of 2.sup.nd Int'l. Symposium on Cleaning Tech. In Semiconductor Device Mfg.*, pp. 18-25 (Oct. 1992).

Vig, J., "UV/Ozone Cleaning of Surfaces." *U.S. Army Elec. Tech. and Devices Lab.*, pp. 1-26.

Vig, J., "UV/Ozone Cleaning of Surfaces: A Review." *Surface Contamination: Genesis, Detection, and Control*, pp. 235-253 (1979).

Vig, J., et al., "UV/Ozone Cleaning of Surfaces." *IEEE Transactions on Parts, Hybrids, and Packaging*, vol. PHP-12(4):365-370 (Dec. 1976).

Vig, J., "UV/Ozone Cleaning of Surfaces." *U.S. Army Electronics Technology and Devices Laboratory*, ERADCOM, Ft. Monmouth, NJ, 07703-5302, pp. 1027-1034 (Sep./Oct. 1984).

Zafonte, L., et al., "UV/Ozone Cleaning For Organics Removal on Silicon Wafers." *SPIE Optical Microlithography III: Technology for the Next Decade*, 470:164-175 (1984).

Zazzera, L.A., et al., "XPS and SIMS Study of Anhydrous HF and UV/Ozone-Modified Silicon (100) Surfaces." *J. Electrochem. Soc.*, 136(2):484-491 (Feb. 1989).

"Ozone Concentration Measurement in a Process Gas." *Proposed IOA Pan American Group Guideline*, pp. 1-21 (Dec. 1993).

"Ozone for Semiconductor Applications." *Sorbios*, pp. 1-6 (Oct. 1991).

Bergman, E. et al., "HF-Ozone Cleaning Chemistry," *Solid State Technology* 46(7):115-124(2001).

* cited by examiner

METHODS OF THINNING A SILICON WAFER USING HF AND OZONE

This application is a Continuation-in-Part of U.S. patent application Ser. No. 09/621,028, filed Jul. 21, 2000 and now U.S. Pat. No. 6,869,487, which is: a Continuation-in-Part of Ser. No. 60/145,350 filed Jul. 23, 1999; a Continuation-in-Part of Ser. No. 08/853,649, filed May 9, 1997 and now U.S. Pat. No. 6,240,933; and a Continuation-in-Part and U.S. National Phase Application of International Application PCT/US99/08516, filed Apr. 16, 1999, which in turn is a Continuation-in-Part of U.S. Patent Application Ser. Nos. 60/125,304 filed Mar. 19, 1999; 60/099,067 filed Sep. 3, 1998; and Ser. No. 09/061,318, filed Apr. 16, 1998. These applications are also incorporated herein by reference.

BACKGROUND OF THE INVENTION

Silicon wafer thinning is an important step in the manufacture of semiconductor devices and micro-electro mechanical systems (MEMS). Wafer thinning is vital because it aids in preventing heat build-up in the wafer during manufacture and use, and also makes the wafer easier to handle and less expensive to package.

Traditionally, the wafer thinning process has been performed by grinding and polishing operations commonly referred to as "backgrinding," or by using solutions containing strong oxidizers such as nitric acid ($HNO_3$) and/or hydrofluoric acid (HF). These two processes are also often combined, because the mechanical grinding operation induces a significant amount of stress in the silicon surface. This stress may be alleviated by chemical etching, which removes the stressed and damaged layer. The chemical reactions for this process generally proceed as follows:

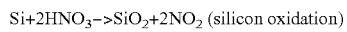

$Si + 2HNO_3 \rightarrow SiO_2 + 2NO_2$ (silicon oxidation)

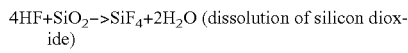

$4HF + SiO_2 \rightarrow SiF_4 + 2H_2O$ (dissolution of silicon dioxide)

From these reactions, it is apparent that the silicon removal mechanism is the formation of silicon dioxide by exposure to an oxidizing agent ($HNO_3$), followed by the reaction of the silicon dioxide with fluorine to form silicon tetrafluoride ($SiF_4$), which can be dissolved in an aqueous carrier or evolved as a gas. While numerous oxidizing agents have been experimented with, there appear to be few alternatives to fluorine for the reaction to effectively proceed.

One problem with this process is that it is difficult to control, due to the consumption of reactants and the evolution of nitrous oxides which dissolve into the etchant solution, thereby "poisoning" the bath by saturation, which will affect subsequent etches. The process also requires large volumes of expensive process chemicals, involves a great deal of hazardous waste, and is difficult to control to the extent required in order to deliver optimal etch uniformity.

Alternative silicon etchants include caustic solutions such as potassium hydroxide or sodium hydroxide, or fluorine plasma chemistries such as $SiF_6$. The two primary classes of silicon etchants can thus be classed as either aqueous chemistries applied in the liquid state (e.g., $HNO_3$, HF, or caustics), or fluorine plasmas. Each of these process categories has certain applications and limitations.

In the case of aqueous chemistries, limitations include the cost of the chemicals, the need for significant amounts of water for rinsing, the creation of large volumes of waste (chemical and rinse water), and the inability to deliver the etchant into small geometries, which are common in semiconductor devices and MEMS devices. In general, caustics are not favored in the semiconductor industry, due to commonly known problems associated with mobile ion contamination. This is especially true of elements such as Na and K.

In the case of plasma chemistries, the cost of the processing equipment and supporting hardware (e.g., vacuum pumps) can be quite high. Many plasma processes are designed to deliver an anisotropic etch profile. While this has many desirable features, it has a tendency to create very sharp corners on system geometries, which can lead to device breakdown. Many of these systems are also designed for single-wafer processing, which can prove detrimental, depending on throughput requirements. Additionally, plasmas are relatively expensive, dirty, and are not configured for the removal of several hundred microns of silicon as required in a wafer thinning operation.

Thus, there is a need for an improved method of thinning silicon wafers used in semiconductor devices and/or MEMS devices.

SUMMARY OF THE INVENTION

The present invention is directed to a method of thinning a silicon wafer using ozone and HF. The ozone oxidizes one or more layers of silicon on the wafer surface, and the HF etches away the oxidized silicon layer, thereby thinning the wafer.

In a first aspect, ozone gas is delivered into a process chamber containing a silicon wafer. HF vapor is delivered into the process chamber, either simultaneously with the ozone gas, or after the ozone gas delivery has begun. The HF vapor is preferably delivered via a carrier gas, which may also be ozone gas, or may be an inert gas. The HF vapor etches the oxidized silicon layer to thin the wafer.

In another aspect, ozone gas is delivered into a process chamber containing a silicon wafer. Anhydrous HF gas is delivered into the process chamber While deionized (DI) water is sprayed onto a surface of the wafer. The anhydrous HF gas dissolves into the DI water, which may form a microscopic aqueous boundary layer on the wafer surface, and etches the oxidized silicon layer on the wafer surface to thin the wafer. The wafer may be rinsed after the etching process is completed.

In another aspect, ozone gas is delivered into a process chamber containing a silicon wafer in order to oxidize a layer of silicon on the wafer into $SiO_2$. HF is delivered into the process chamber to react with the $SiO_2$ layer and convert the $SiO_2$ layer into $SiF_4$. The $SiF_4$ is then removed to thin the wafer.

Any of the described processes may be combined and/or repeated one or more times to achieve optimal results. Other features and advantages of the invention will appear hereinafter. The invention resides as well in sub-combinations of the features described, as well as in the system or apparatus shown in the drawings and described below.

DETAILED OF DESCRIPTION OF THE DRAWINGS

In a method of thinning a silicon wafer, ozone gas or vapor is delivered into a process chamber containing a silicon wafer. The ozone oxidizes one or more layers of silicon on the wafer surface. HF etches away the oxidized silicon layer, thereby thinning the wafer. The HF may be provided in vapor form, anhydrous gas form, or aqueous form. The HF may be delivered simultaneously with, or shortly following, the delivery of the ozone into the process chamber. Other steps and features described below may be advantageous but are not necessarily essential to the invention.

The methods described herein for processing silicon wafers, which provide support for semiconductor devices and/or MEMS devices, may be performed in a variety of processing systems. Conventional semiconductor wafer processing systems, for example, may be used to process the silicon wafers. Moreover, one or more processing systems may be used to perform the various processing steps described herein. Thus, the processing system 10 described below is only one example of a processing system that could be used to process silicon wafers according to the claimed methods.

Figure 1:
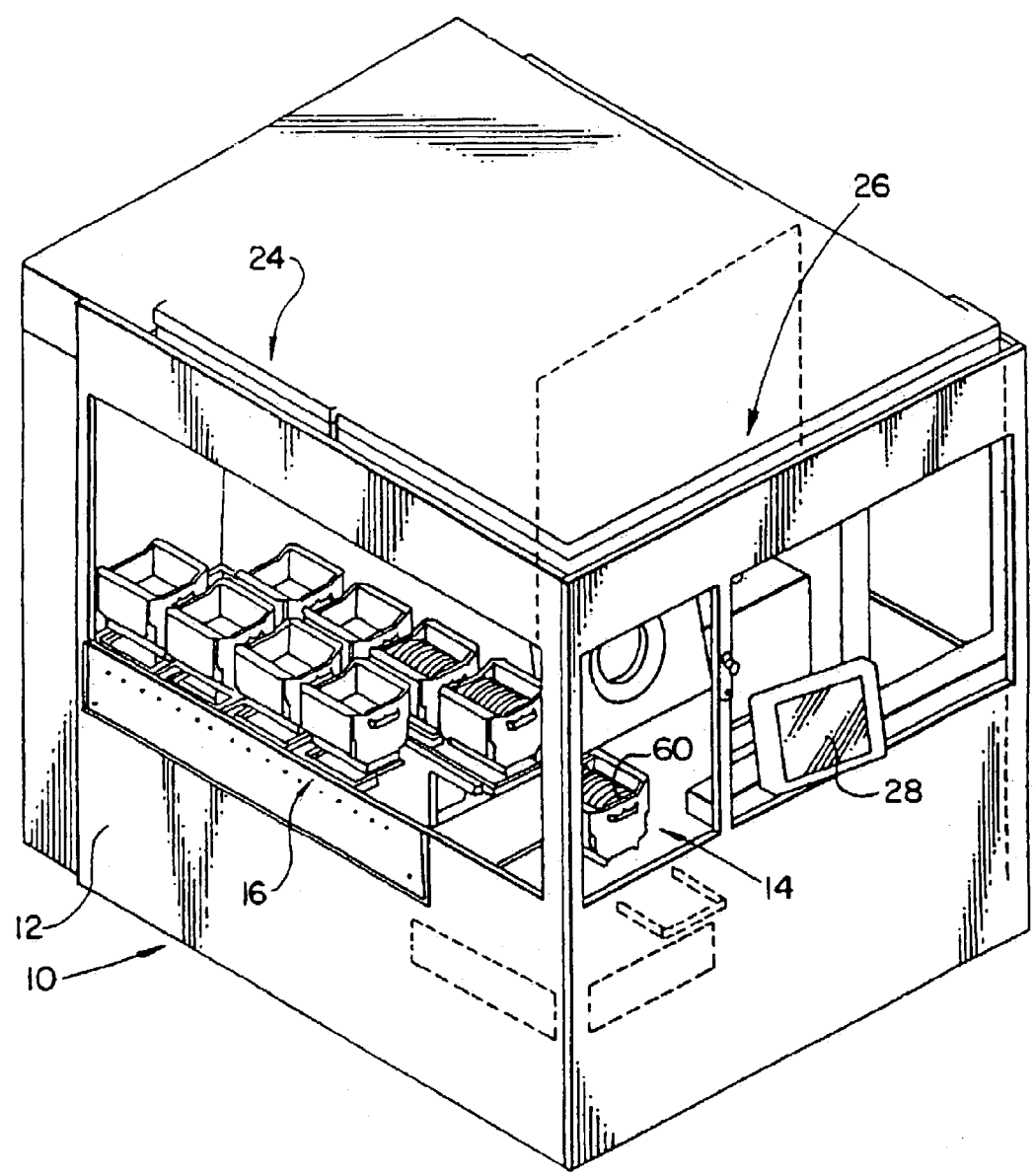
FIG. 1 is a perspective view of a wafer processing system.
Figure 2:
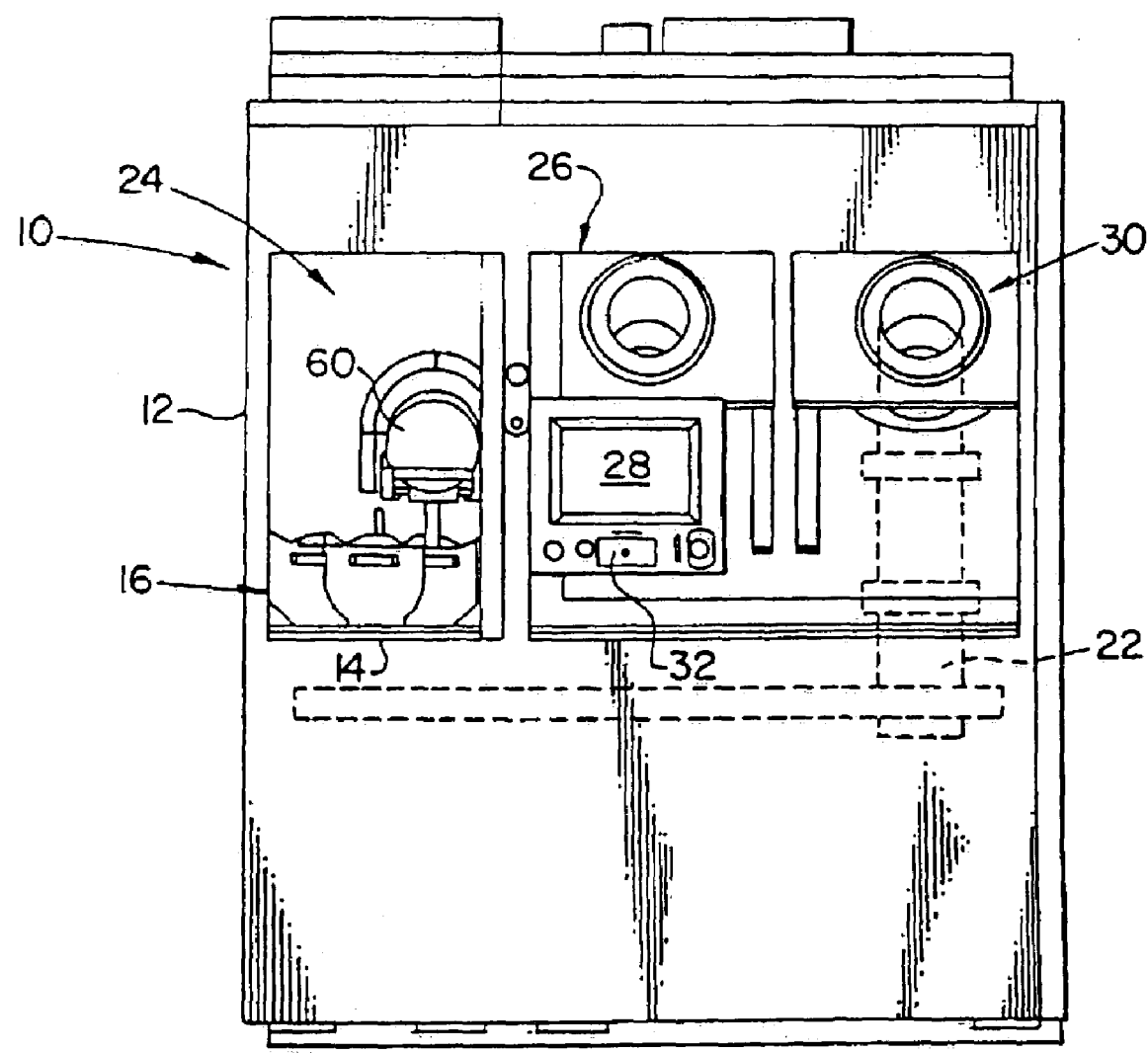
FIG. 2 is a front view of the wafer processing system illustrated in FIG. 1.

Turning now in detail to the drawings, as shown in FIGS. 1 and 2, a wafer processing system 10 preferably includes an enclosure 12 to maintain and control clean airflow and reduce contamination of wafers being processed in the processing system 10. An input/output station 14 at the front of the system 10 allows wafers 60 to be loaded and unloaded to and from the system 10. An indexer 16, or other temporary wafer storage station, is preferably provided adjacent to the input/output station 14.

The system 10 may be divided into an interface section 24 and a process section 26. These sections may be separated by a partition having a door opening. The interface section 24 includes the input/output station 14 and the indexer 16. The process section 26 includes one or more process stations 30, with each process station 30 including a wafer processor. The interface section 24 also preferably includes a process robot 22 for moving wafers 60 between the indexer 16 and the processor unit. A control panel 28 may be provided on the enclosure 12, to allow instructions or programming to be input into a computer controller 32 which controls the system 10.

The wafers 60 may be provided in open carriers, cassettes, or trays, and handled as described in U.S. Pat. Nos. 6,279,724 or 5,664,337, both incorporated herein by reference. Alternatively, the wafers 60 may be provided within sealed pods or containers which are unsealed at a docking station, as described in U.S. Pat. No. 6,447,232 or U.S. patent application Ser. Nos. 09/612,009 or 10/200,074, each incorporated herein by reference.

The processors 30 in the processing system 10 may be batch processors or single wafer processors (e.g., as described in U.S. Pat. No. 6,423,642, incorporated herein by reference), similar to those used in existing semiconductor wafer processing systems. Several variations of batch processors and/or single wafers processors may be used. For example, a batch processor with a 25-wafer capacity, or alternatively, a 50-wafer capacity, may be used.

The processors 30 preferably each include a rotatable wafer holder or rotor, so that the wafers 60 may be rotated during processing. Rotation of the wafers 60 may be used for distributing process fluids evenly across the wafer surfaces, for spin-drying the wafers 60, or for other reasons, as is common in the processing of semiconductor wafers.

Figure 3:
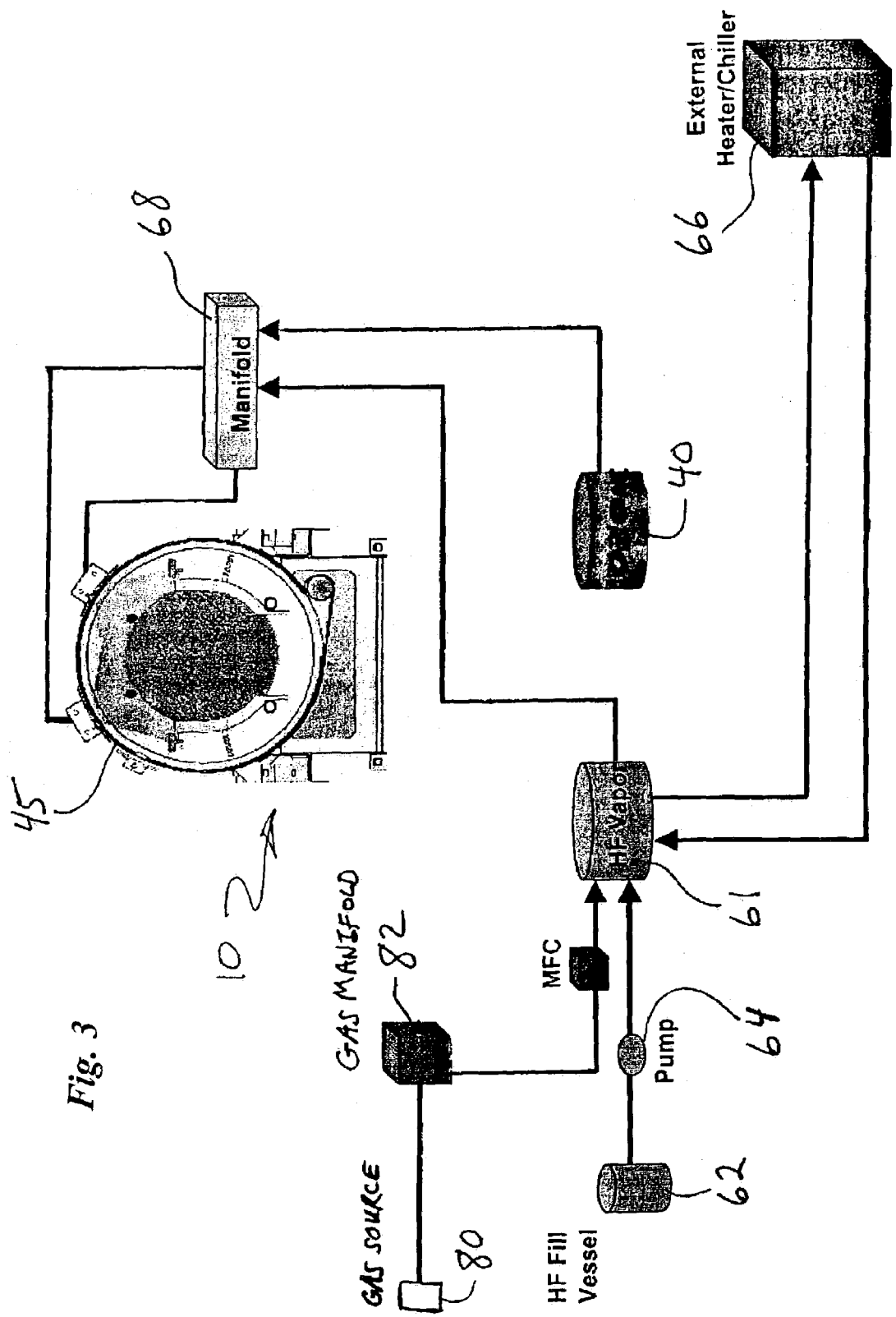
FIG. 3 is a schematic diagram of a wafer processing system that may be used to perform the wafer thinning methods of the preferred embodiments.

FIG. 3 is a schematic flow diagram of a preferred wafer processing system. In operation, one or more wafers 60 are loaded into a wafer holder or rotor in a process chamber 45, which may comprise a batch processor or a single wafer processor. The wafers 60 may be loaded manually, by a robot, or by another suitable loading device. The wafers 60 may be handled or contacted directly by the robot or rotor. Alternatively, the wafers 60 may be handled within a carrier tray or cassette, which is placed into the rotor or other holder.

Once the wafers 60 are loaded into the processor, the process chamber 45 is preferably closed, and may optionally form a fluid-tight seal. Ozone ($O_3$) gas is then provided into the process chamber from an ozone source 40. The ozone gas may be delivered into the process chamber 45 via a manifold 68, nozzles, or another suitable device. The ozone gas preferably fills the process chamber 45 to form an ozone environment. The ozone may alternatively be mixed with HF vapor before entering the process chamber 45, and/or may be used as a carrier gas for HF vapor, as described below.

The ozone oxidizes one or more layers of silicon on the wafers 60, converting the silicon to silicon dioxide ($SiO_2$). Pure oxygen ($O_2$) may alternatively be used to convert the silicon layer into silicon dioxide. The silicon oxidizing reaction generally proceeds as follows:

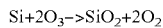

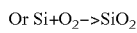

HF vapor is provided into the process chamber 45 to etch the oxidized silicon layer. To generate the HF vapor, HF liquid may be provided in an HF fill vessel 62, and then pumped into an HF vaporizer 61 with a pump 64. The HF vaporizer 61 is preferably connected to a heat exchanger 66, which may provide heat to the HF vaporizer 61 to convert the HF liquid into HF vapor. In general, the vapor may be generated as described in U.S. Pat. No. 6,162,734, incorporated herein by reference. The generated HF vapor is provided into the process chamber via the vapor delivery manifold 68, or another suitable device.

The HF vapor may be delivered into the process chamber 45 after the ozone begins to enter the process chamber 45, or it may be mixed with the ozone before entering the process chamber 45. The key element is that the silicon surface of a wafer 60 is oxidized by the ozone, and the oxidized surface is then etched by the HF vapor. The wafers 60 may be rotated in the rotor to promote homogenous mixing and chemical distribution on the wafer surfaces.

The HF vapor is preferably mixed with a carrier gas, such as nitrogen ($N_2$) gas, for delivering the HF vapor into the process chamber 45, as is common in the semiconductor wafer manufacturing industry. $N_2$ gas, or a gas with similar properties, may also be delivered to the process chamber 45 after the wafers 60 are processed, in order to purge any remaining HF vapor from the process chamber 45 before the chamber door is opened. The use of HF vapor in conjunction with a carrier gas, as well as possible configurations for generating HF vapor for use in etch applications, is described in U.S. Pat. Nos. 5,954,911 and 6,162,735, incorporated herein by reference.

Other gasses, such as compressed dry air, oxygen, and $CO_2$, could alternatively be used as a carrier gas. Ozone gas may also be used as the carrier gas, and may be preferable in some applications, since it is integral to the oxidizing process, and would minimize the dilution effects of using an inert gas, such as nitrogen. The carrier gas is preferably delivered from a gas source 80 into gas manifold 82. The carrier gas preferably exits the manifold 82 and is delivered through a mass flow controller (MFC) 84 into the HF vaporizer 61, and to any other desired system components. The MFC is preferably an electronic device that controls the mass of the carrier gas that flows to the other system components.

The carrier gas passes through the HF vaporizer 61, where it entrains the HF vapors and carries them to the process chamber 45 to react with the oxidized silicon layer, or other material to be etched. To generate the HF vapor, the carrier gas may be bubbled through the HF solution in the-HF vaporizer 61, or may be flowed across the surface or the HF solution, thereby becoming enriched in HF and water vapor. Alternatively, the HF vapor may be generated by heating or sonically vaporizing the HF solution.

When the HF vapor enters the process chamber 45, it may form a visible condensate film on the surface of the wafers 60. Regardless of whether a visible condensate film is formed, a microscopic aqueous boundary layer, which is condensed from the gas/vapor phase environment in the process chamber 45, is preferably formed on the wafer surface. HF vapor and/or ozone are present in the microscopic boundary layer as dissolved or diffused species from the surrounding gas/vapor environment.

There is a significant distinction between a microscopic boundary layer and a macroscopic boundary layer, which is often used in semiconductor wafer cleaning operations (as opposed to thinning operations). The microscopic boundary layer is a condensed phase layer formed from a vapor/gas environment, whereas a macroscopic boundary layer is a visible liquid formed on the wafer surface by spraying or otherwise delivering an aqueous solution onto the wafer surface.

The objective in wafer thinning is to form a microscopic liquid boundary layer on the wafer surface that has condensed from the gas/vapor phase. Because the boundary layer is microscopic, the wafer surface never becomes "wet" in the conventional wafer-cleaning sense. Thus, rinsing and drying are typically not required in the wafer thinning operations described herein, whereas rinsing and drying are typically required in semiconductor cleaning operations. Rinsing and drying may optionally be used, however, after the etching process is completed, to remove any contaminants from the wafer surface.

The HF vapor enters the process chamber and begins to etch the silicon dioxide film on the wafers 60. Fresh ozone gas is preferably continuously supplied into the process chamber 45 during the etching process, in order to continually oxidize the exposed silicon surface of the wafer. The HF vapor reacts with the silicon dioxide to form silicon tetrafluoride ($SiF_4$), which may then be evolved as a gas and removed via a system exhaust, or may be dissolved in an aqueous carrier liquid. The silicon dioxide dissolution reaction generally proceeds as follows:

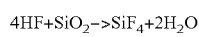
$4HF+SiO_2 \rightarrow SiF_4+2H_2O$

Thus, the entire oxidizing and etching process is generally as follows:

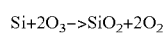
$Si+2O_3 \rightarrow SiO_2+2O_2$

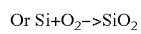
Or $Si+O_2 \rightarrow SiO_2$

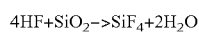
$4HF+SiO_2 \rightarrow SiF_4+2H_2O$

In a typical wafer thinning application, a silicon wafer is etched from a thickness of 500-1000 microns down to 50-100 microns, preferably from 650-850 microns down to 65-85 microns. Accordingly, the HF vapor preferably etches silicon at a rate of 1000 Å/min or higher, more preferably 5000 to 10,000 Å/min or higher (1 micron=10,000 Å). The silicon surface is continuously etched in the presence of HF vapor and ozone until the desired wafer thickness is achieved. Because vaporous HF is used, no rinsing or drying step is required, although rinsing and drying may be used if desired. Additionally, only a minimal amount of chemical is required to thin the wafers, and a relatively small amount of chemical must therefore be disposed of, which is ecologically beneficial.

In an alternative embodiment, HF is delivered into the ozone-filled process chamber as an anhydrous gas. Anhydrous HF gas does not generally produce a significant etch rate on silicon dioxide films. In order for the etch rate to become significant for most applications, the anhydrous HF gas must be mixed with water so that it is no longer anhydrous. The presence of water vapor appears to catalyze the reaction. The absence of water renders the HF gas essentially inert in regards to silicon dioxide. Thus, the anhydrous HF gas is preferably either mixed with water prior to delivery to the wafer surface, or mixed with an aqueous layer on the wafer surface.

In a preferred method, deionized (DI) water, maintained at a controlled temperature, is sprayed onto a wafer surface simultaneously with the delivery of anhydrous HF gas into the process chamber. The anhydrous HF gas dissolves in the DI water, causing the anhydrous HF gas to become aggressive toward the silicon dioxide on the-wafer surface. The anhydrous HF gas, mixed with water, etches the silicon dioxide film on the wafer surface. The etch product ($SiF_4$) may then be evolved as a gas and removed via a system exhaust, or may be dissolved in an aqueous carrier liquid. The wafer may be rotated to promote uniform distribution of the boundary layer, as well as helping to define the thickness of the boundary layer through centrifugal force.

The anhydrous HF gas may alternatively be bubbled into water, or mixed with a water vapor or aerosol, within the processing chamber, or prior to entering the processing chamber. In the latter cases, HF vapor is generated by mixing anhydrous HF gas with water vapor. The anhydrous HF gas may also be mixed with ozone before being delivered into the process chamber. Regardless of how the anhydrous HF gas and the ozone enter the process chamber, both HF and ozone are preferably present in the microscopic aqueous boundary layer at the wafer surface, as described above.

In another embodiment, HF may be delivered into the process chamber as an aqueous solution. The HF solution may have other additives such as ammonium fluoride as a buffer, organic solvents such as ethylene glycol to help promote surface wetting and control ionization, or other commonly used additives. HF and water, however, are preferably the key components to the solution. The other processing steps are performed as described above to thin the wafers.

While the primary focus of the present invention is the use of ozone and HF for the purpose of etching silicon to thin silicon wafers, it is acknowledged that other gas mixtures and additives might also be used to accomplish specific cleaning purposes. For example, alcohol mixtures may be used to help control etch selectivity between various film types exposed to the etchant vapors. HCl may be used to enhance the removal of metal contaminants.

Additionally, several options are viable to conclude the etch processes described herein. For example, a rinse with DI water or another suitable agent may be performed to quench the process. Additionally, the delivery of HF vapor may be continued without ozone in order to ensure an oxide-free hydrophobic silicon surface, or conversely, the delivery of ozone may be continued without HF vapor to ensure an oxidized hydrophilic silicon dioxide surface. Other processes may also be performed to meet the needs of a given application.

The present invention is a method of etching silicon in wafer thinning applications using less expensive and more controllable techniques than those currently practiced. In order to accomplish this, ozone gas is used as a silicon oxidizer, and HF vapor or gas is used to etch the oxidized silicon.

Potential benefits of the methods described herein are that they:
(a) minimize chemical consumption and waste generation in silicon wafer thinning applications;
(b) eliminate the requirement for a post-etch rinse (in some embodiments, such as the vapor phase reaction);
(c) readily lend themselves to a single-side application, where the non-processed side of the wafer would only need to be protected from vapor species (which is much more easily accomplished than is protection from liquid reactants);
(d) lend themselves equally well to batch processing;
(e) create a final wafer surface state (oxidized or bare silicon) that can be easily dictated by process configuration
(f) may be integrated with backgrind or plasma etch processes to remove a portion of the material in conventional grinding operations and then use the ozone/HF process to relieve stresses; and
(g) have the potential to etch other materials, such as gallium arsenide.

The essential elements of the system 10 as shown in FIG. 3 are the HF source 61, the ozone source 40, and the process chamber 45. The other elements shown in FIG. 3 may also be used in combination with these essential elements.

While the term wafer as used here generally refers to silicon or semiconductor wafers, it also encompasses similar flat media articles or workpieces which may not be silicon or a semiconductor, but which may be etched or thinned as described.

While embodiments and applications of the present invention have been shown and described, it will be apparent to one skilled in the art that other modifications are possible without departing from the inventive concepts herein. The invention, therefore, is not to be restricted except by the following claims and their equivalents.

What is claimed is:

1. A method of thinning at least one silicon wafer, comprising:
    placing the wafer into a process chamber;
    spinning the wafer;
    spraying a liquid including water onto the spinning wafer, with the liquid forming a substantially uniform liquid layer on the wafer;
    controlling a thickness of the liquid layer;
    providing hydrofluoric acid in an aqueous form in the process chamber, with the hydrofluoric acid etching a silicon dioxide layer on a surface of the wafer; and
    providing ozone gas in the process chamber, with the ozone gas oxidizing a silicon surface of the wafer exposed by etching the silicon dioxide layer, and with the HF etching the oxidized silicon surface until the wafer is thinned to approximately 5 to 20% of its initial thickness.

2. The method of claim 1 with the HF etching the silicon at a rate over 1000 angstroms/minute.

3. The method of claim 2 with the HF etching the silicon at a rate of 5000-10000 angstroms/minute.

4. The method of claim 1 with the wafer thinned to a thickness of 50-100 microns.

5. The method of claim 1 further comprising continuously supplying fresh ozone gas into the process chamber to continually oxidize the exposed silicon surface.

6. The method of claim 1 wherein the oxidized silicon is removed as $SiF_4$ in vapor form from the process chamber.

* * * * *